US012777816B2

(12) United States Patent
Cai

(10) Patent No.: US 12,777,816 B2
(45) Date of Patent: Oct. 27, 2026

(54) DISPLAY MODULE AND DISPLAY DEVICE INCLUDING ULTRA-THIN GLASS

(71) Applicant: WUHAN CHINA STAR OPTOELECTRONICS SEMICONDUCTOR DISPLAY TECHNOLOGY CO., LTD., Wuhan (CN)

(72) Inventor: Zhenfei Cai, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 967 days.

(21) Appl. No.: 17/280,861

(22) PCT Filed: Dec. 28, 2020

(86) PCT No.: PCT/CN2020/140230
§ 371 (c)(1),
(2) Date: Sep. 6, 2023

(87) PCT Pub. No.: WO2022/134134
PCT Pub. Date: Jun. 30, 2022

(65) Prior Publication Data
US 2023/0422580 A1 Dec. 28, 2023

(30) Foreign Application Priority Data
Dec. 23, 2020 (CN) ........................ 202011538332.7

(51) Int. Cl.
*H10K 59/80* (2023.01)
*H10K 59/40* (2023.01)
(Continued)

(52) U.S. Cl.
CPC ......... *H10K 59/8721* (2023.02); *H10K 59/40* (2023.02); *H10K 59/873* (2023.02);
(Continued)

(58) Field of Classification Search
CPC .. H10K 59/8721; H10K 59/40; H10K 59/873; H10K 59/8793; H10K 59/8731; H10K 59/8791; G09F 9/30
See application file for complete search history.

(56) References Cited

U.S. PATENT DOCUMENTS

| | | | | |
|---|---|---|---|---|
| 7,026,660 B2 * | 4/2006 | Guenther | H10K 59/179 257/40 |
| 9,412,967 B2 * | 8/2016 | Chen | H10K 30/88 |

(Continued)

FOREIGN PATENT DOCUMENTS

| | | | |
|---|---|---|---|
| CN | 103474580 A * | 12/2013 | H10K 59/873 |
| CN | 103779379 A | 5/2014 | |

(Continued)

*Primary Examiner* — Ida M Soward
(74) *Attorney, Agent, or Firm* — PV IP PC; Peter Stecher; Wei Te Chung

(57) ABSTRACT

A display module, a manufacturing process thereof, and a display device are provided. In the manufacturing process of the display module, a substrate glass of a display panel is thinned to form an ultra-thin glass with a predetermined thickness, which replaces a conventional polyimide (PI) flexible film layer that is used to support the panel, and thus a laser lift-off process is not required to separate the substrate glass and the PI flexible film layer. It solves a problem that a laser is required to peel the substrate glass and a peeling effect is not good in current manufacturing process of a flexible OLED display screen.

9 Claims, 10 Drawing Sheets

(51) Int. Cl.
*H10K 71/20* (2023.01)
*H10K 102/00* (2023.01)

(52) U.S. Cl.
CPC ....... *H10K 59/8793* (2023.02); *H10K 71/231* (2023.02); *H10K 59/8731* (2023.02); *H10K 59/8791* (2023.02); *H10K 59/8794* (2023.02); *H10K 2102/311* (2023.02)

(56) References Cited

U.S. PATENT DOCUMENTS

| | | | | |
|---|---|---|---|---|
| 10,014,352 | B1 * | 7/2018 | Tsai | H10K 59/40 |
| 2016/0233248 | A1 * | 8/2016 | Kwak | H10K 59/8722 |
| 2016/0315284 | A1 * | 10/2016 | Jeon | H10K 59/8722 |
| 2017/0186819 | A1 * | 6/2017 | Yun | H10K 59/38 |
| 2018/0019439 | A1 * | 1/2018 | Lee | H10K 59/8731 |
| 2018/0158894 | A1 * | 6/2018 | Park | H10K 59/131 |
| 2018/0309084 | A1 * | 10/2018 | Jhou | H10K 50/8426 |
| 2019/0259965 | A1 * | 8/2019 | Jeon | H10K 59/40 |

FOREIGN PATENT DOCUMENTS

| | | | | | |
|---|---|---|---|---|---|
| CN | 103943605 | A | | 7/2014 | |
| CN | 104538557 | A | | 4/2015 | |
| CN | 107611286 | A | | 1/2018 | |
| CN | 107871822 | A | | 4/2018 | |
| CN | 108920034 | A | * | 11/2018 | G06F 3/0412 |
| CN | 111162194 | A | | 5/2020 | |
| CN | 111276518 | A | | 6/2020 | |
| KR | 20120093100 | A | * | 8/2012 | H10K 50/8426 |
| TW | 1413038 | B | * | 10/2013 | H10K 77/111 |

* cited by examiner

DISPLAY MODULE AND DISPLAY DEVICE INCLUDING ULTRA-THIN GLASS

RELATED APPLICATIONS

This application is a Notional Phase of PCT Patent Application No. PCT/CN2020/140230 having international filing date of Dec. 28, 2020, which claims the benefit of priority of Chinese Patent Application Nos. 202011538332.7 filed on Dec. 23, 2020. The contents of the above applications are all incorporated by reference as if fully set forth herein in their entirety.

FIELD OF INVENTION

This application relates to the field of display technology, in particular to a display module, a manufacturing method thereof, and a display device.

BACKGROUND OF INVENTION

Flexible organic light-emitting diode (OLED) display screens have advantages of active light emission, wide viewing angles, wide color gamut, high brightness, fast response times, less power consumption, and structural flexibility and foldability. They are becoming more and more popular in the market. Utilizing bendable and foldable characteristics of the flexible OLED display screens, various forms of folding display devices can be made, which are convenient for carrying and storing when going out.

With gradual maturation of flexible OLED display screen manufacturing technology, current manufacturing process of the flexible OLED display screens generally includes: taking a substrate glass as a substrate, coating a polyimide (PI) flexible film layer on the substrate glass, and then forming a thin film transistor (TFT) array and a top-emitting OLED device on the PI flexible film layer. A pixel anode of the top-emitting device adopts a reflective anode and a cathode adopts a transparent cathode, so light is emitted upward. Finally, a module manufacturing process is performed. In the module manufacturing process, a bonding process is performed first, then the substrate glass and the PI flexible film layer are separated by a laser lift-off (LLO) process. However, the LLO process requires high cleanliness and laser uniformity, and it is difficult to implement on a large-sized display screen. Once foreign particles fall in, the PI flexible film layer will be broken and the flexible OLED display screen will fail.

Therefore, it is necessary to solve the problem that a laser is required to peel the substrate glass and a peeling effect is not good in the current manufacturing process of the flexible OLED display.

SUMMARY OF INVENTION

Technical Problem

The present application provides a display module, a manufacturing method thereof, and a display device to solve the technical problem that the current flexible OLED display manufacturing process requires a laser to peel off the substrate glass and the effect is not good.

Technical Solution to Technical Problem

Technical Solutions

To solve the above problems, the technical solutions provided by this application are as follows:

An embodiment of the application provides a display module, including a driving circuit layer, a light-emitting functional layer, an encapsulation layer, and a supporting structure laminated on the ultra-thin glass. The driving circuit layer is disposed on a side of the ultra-thin glass. The light-emitting functional layer is disposed on a side of the driving circuit layer away from the ultra-thin glass. The encapsulation layer is disposed on a side of the light-emitting functional layer away from the driving circuit layer. The supporting structure is disposed on a side of the encapsulation layer away from the light-emitting functional layer.

In the display module provided by an embodiment of the present application, the supporting structure includes a backplate.

In the display module provided by an embodiment of the present application, the supporting structure includes a backplate and a stainless-steel film, the backplate is attached to the encapsulation layer, and the stainless-steel film is attached to the backplate.

In the display module provided by an embodiment of the present application, further includes a polarizer disposed on a side of the ultra-thin glass away from the driving circuit layer.

In the display module provided by an embodiment of the present application, further including a color film layer disposed on a side of the ultra-thin glass away from the driving circuit layer.

In the display module provided by an embodiment of the present application, further including a touch functional layer disposed between the ultra-thin glass and the driving circuit layer.

In the display module provided by an embodiment of the present application, further including a touch panel attached to a side of the ultra-thin glass away from the driving circuit layer.

In the display module provided by an embodiment of the present application, a thickness of the ultra-thin glass ranges from 30 microns to 60 microns.

An embodiment of the present application also provides a manufacturing method of a display module, including: providing a display panel including a substrate glass, a driving circuit layer, a light-emitting functional layer, and an encapsulation layer; attaching a backplate to the encapsulation layer; performing a thinning process on the substrate glass to form an ultra-thin glass having a predetermined thickness; and attaching a polarizer under the ultra-thin glass.

In the manufacturing method of the display module provided by an embodiment of the present application, attaching the polarizer under the ultra-thin glass includes: attaching a touch panel under the ultra-thin glass, and attaching the polarizer under the touch panel by an optical glue.

In the manufacturing method of the display module provided by an embodiment of the present application, the display panel further includes a touch functional layer positioned between the substrate glass and the driving circuit layer, wherein attaching the polarizer under the ultra-thin glass includes attaching the polarizer directly under the ultra-thin glass by an optical glue.

In the manufacturing method of the display module provided by an embodiment of the present application, the predetermined thickness ranges from 30 microns to 60 microns.

In the manufacturing method of the display module provided by an embodiment of the present application, after performing the thinning process on the substrate glass to form the ultra-thin glass having the predetermined thickness, further including: attaching a stainless-steel film above the backplate.

In the manufacturing method of the display module provided by an embodiment of the present application, performing the thinning process on the substrate glass to form the ultra-thin glass having the predetermined thickness further includes: attaching a protective film to the backplate to cover the backplate and the driving circuit layer, the light-emitting functional layer, and side walls of the encapsulation layer; placing the substrate glass in an etching solution with a predetermined concentration; taking out the ultra-thin glass from the etching solution after a predetermined time period when the substrate glass is thinned to the predetermined thickness to form the ultra-thin glass; and washing the ultra-thin glass and removing the protective film.

In the manufacturing method of the display module provided by an embodiment of the present application, the etching solution includes an acid etching solution.

In the manufacturing method of the display module provided by an embodiment of the present application, performing the thinning process on the substrate glass to form the ultra-thin glass having the predetermined thickness includes: thinning the substrate glass by physical grinding to form the ultra-thin glass having the predetermined thickness, and cause a surface of the ultra-thin glass formed with a convex-concave structure.

In the manufacturing method of the display module provided by an embodiment of the present application, performing the thinning process on the substrate glass to form the ultra-thin glass having the predetermined thickness includes: thinning the substrate glass by means of plasma etching to form the ultra-thin glass having the predetermined thickness, and cause a surface of the ultra-thin glass formed with a convex-concave structure.

An embodiment of the present application also provides a display device including a display module. The display module includes a driving circuit layer, a light-emitting functional layer, an encapsulation layer, and a supporting structure laminated on the ultra-thin glass. The driving circuit layer is disposed on a side of the ultra-thin glass. The light-emitting functional layer is disposed on a side of the driving circuit layer away from the ultra-thin glass. The encapsulation layer is disposed on a side of the light-emitting functional layer away from the driving circuit layer. The supporting structure is disposed on a side of the encapsulation layer away from the light-emitting functional layer.

In the display device provided by an embodiment of the present application, further including a touch functional layer disposed between the ultra-thin glass and the driving circuit layer.

In the display device provided by an embodiment of the present application, further including a touch panel attached to a side of the ultra-thin glass away from the driving circuit layer.

Beneficial Effect of Present Disclosure

Beneficial Effect

The beneficial effects of this application are: The display module, the manufacturing method thereof, and the display device provided by the present application adopt a solution that the driving circuit layer and the light-emitting functional layer are directly formed on the substrate glass, and then the substrate glass is thinned to form an ultra-thin glass. The ultra-thin glass is obtained by processing the substrate glass, and the conventional PI flexible film for supporting the panel is replaced with the ultra-thin glass, so there is no need to use a laser lift-off process to separate the substrate glass and the PI flexible film It can prevent problems such as high requirements for cleanliness and laser uniformity in the laser lift-off process, difficulty in implementing on a large-sized display screen, and PI flexible film breakage caused by the existence of foreign particles. Also, it solves the problem that a laser is required to peel the substrate glass and the peeling effect is not good in current manufacturing process of the flexible OLED display screen. In addition, when the display module of the present application adopts bottom emission solution, due to the existence of ultra-thin glass formed by thinning the substrate glass, there is no need to attach an ultra-thin glass as a cover plate on a light-emitting surface. It prevents problems such as cracking of the ultra-thin glass when attaching the ultra-thin glass, which results in serious yield loss.

BRIEF DESCRIPTION OF DRAWINGS OF PRESENT DISCLOSURE

Description of Drawings

In order to more clearly explain the embodiments or the technical solutions in the prior art, the following will briefly introduce the drawings in the description of the embodiments or the prior art. Obviously, the drawings in the following description are only some embodiments of the invention. For those of ordinary skill in the art, other drawings can be obtained from these drawings without creative work.

DETAILED DESCRIPTION OF PREFERRED EMBODIMENTS

Figure 1:
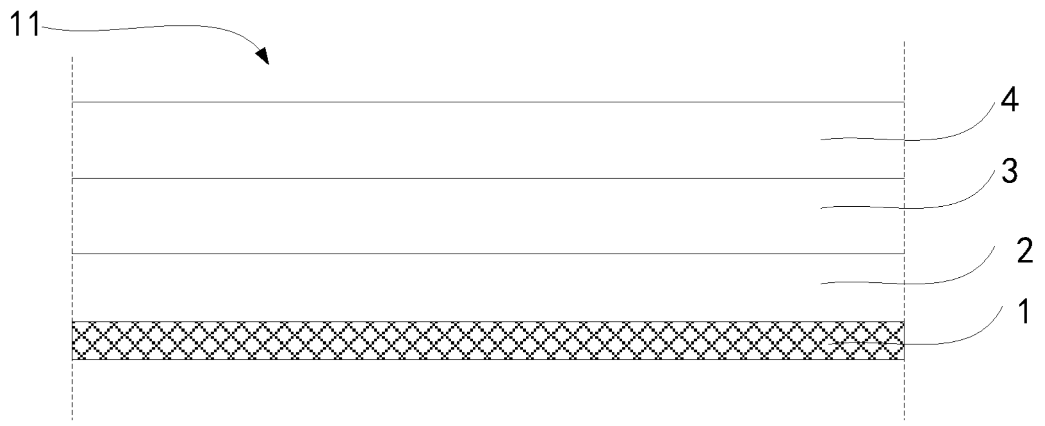
FIG. 1 is a schematic diagram of a first cross-sectional structure of a flexible display panel provided by an embodiment of the present application.

The description of the following embodiments refers to the drawings to illustrate specific embodiments that can be implemented in this application. The directional terms mentioned in this application, such as “upper”, “lower”, “front”, “rear”, etc., are only directions for referring to the drawings. Therefore, the directional terms are used to illustrate and understand the application, rather than to limit the application. In the figure, units with similar structures are indicated by the same reference numerals. In the drawings, the thickness of some layers and regions is exaggerated for clear understanding and ease of description. That is, the size and thickness of each component shown in the drawings are arbitrarily shown, but the application is not limited thereto.

Please refer to FIG. 1, which is a schematic diagram of a first cross-sectional structure of a flexible display panel provided by an embodiment of the present application. The flexible display panel 11 includes an ultra-thin glass (UTG) 1, a driving circuit layer 2, a light-emitting functional layer 3, and an encapsulation layer 4. The driving circuit layer 2 is disposed on one side of the ultra-thin glass 1. The light-emitting functional layer 3 is disposed on one side of the driving circuit layer 2 away from the ultra-thin glass 1. The encapsulation layer 4 is disposed on one side of the light-emitting functional layer 3 away from the driving circuit layer 2, wherein, the driving circuit layer 2 is configured to drive the light-emitting functional layer 3 to emit light and provide pixels for the display of the flexible display panel 11. The encapsulation layer 4 is configured to protect the light-emitting device of the light-emitting functional layer 3, and prevent water and oxygen from invading the light-emitting device and causing failure. The thickness of the ultra-thin glass 1 ranges from 30 microns to 60 microns.

The thickness of the ultra-thin glass 1 is very thin, and has the characteristics of being bendable, flexible, and not shatterable. Using the ultra-thin glass 1 as a base substrate can not only support the functional film layers (including the driving circuit layer 2, the light-emitting functional layer 3) of the flexible display panel 11, but also enable the flexible display panel 11 to be bent or rolled. In addition, the high modulus characteristics of the ultra-thin glass 1 can reduce the stress on the functional film layers of the flexible display panel 11 when the flexible display panel 11 is bent or rolled.

It should be noted that the functional film layers on the ultra-thin glass 1 are first manufactured on a conventional substrate glass. After the manufacturing of each functional film layer is completed, the conventional substrate glass is thinned to a predetermined thickness through a thinning process to form the ultra-thin glass 1. The predetermined thickness is the range of the thickness of the ultra-thin glass 1 described above.

In the flexible display panel 11 of this embodiment, the ultra-thin glass 1 is obtained by processing the substrate glass. The ultra-thin glass 1 can replace the conventional polyimide (PI) flexible film for supporting a panel, so there is no need to use a laser lift-off process to separate the substrate glass from the PI flexible film. It prevents problems such as high requirements of cleanliness and laser uniformity for the laser lift-off process, difficulty in implementing on a large-sized display screen, and PI flexible film breakage caused by the existence of foreign particles. Also, it solves the problem that a laser is required to peel the substrate glass and the peeling effect is not good in current manufacturing process of the flexible OLED display screen.

Figure 2:
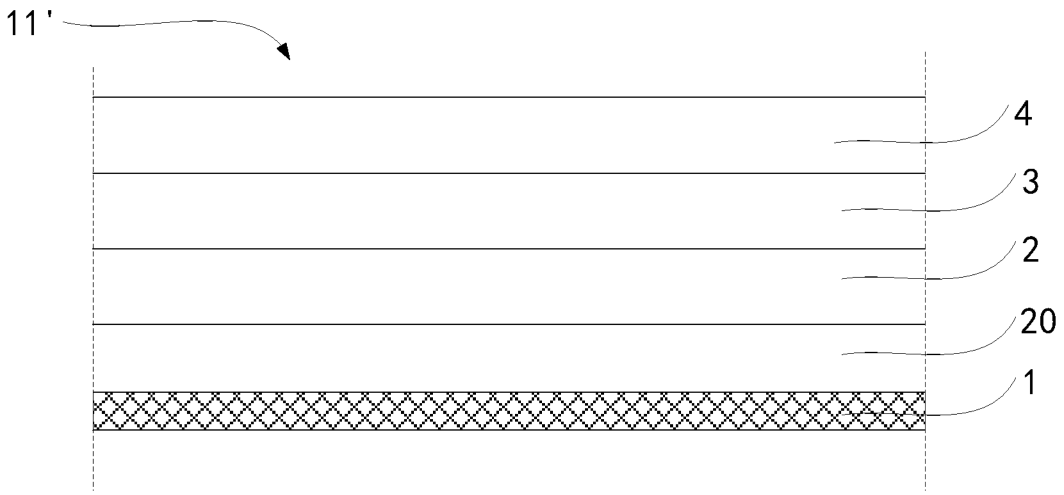
FIG. 2 is a schematic diagram of a second cross-sectional structure of a flexible display panel provided by an embodiment of the present application.

In an embodiment, please refer to FIG. 2, which is a schematic diagram of a second cross-sectional structure of a flexible display panel provided by an embodiment of the present application. The difference from the above-mentioned embodiment is that the flexible display panel 11' further includes a touch functional layer 20. The touch functional layer 20 is disposed between the ultra-thin glass 1 and the driving circuit layer 2, and the touch functional layer 20 adopts an in-cell touch solution. For other descriptions, please refer to the above-mentioned embodiment, which will not be repeated here, and the specific structure and function of each functional film layer of the flexible display panel will be described in detail below.

Figure 3:
FIG. 3 is a schematic diagram of a first cross-sectional structure of a display module provided by an embodiment of the present application.
Figure 4:
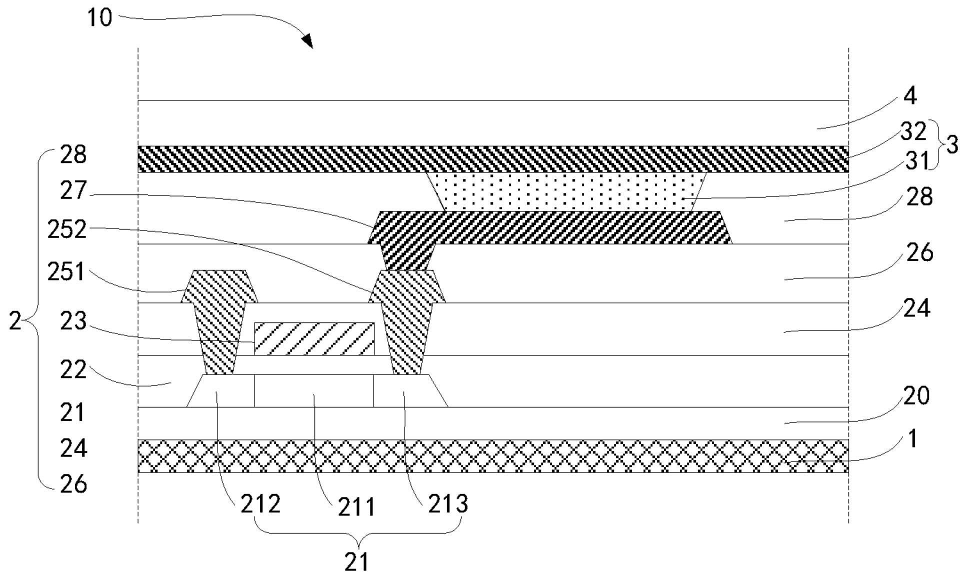
FIG. 4 is a schematic diagram of a cross-sectional structure of a display panel provided by an embodiment of the present application.

Please refer to FIG. 3 and FIG. 4 together. FIG. 3 is a schematic diagram of a first cross-sectional structure of a display module provided by an embodiment of the present application. FIG. 4 is a schematic diagram of a cross-sectional structure of a display panel provided by an embodiment of the present application. The display module 100 includes the display panel 10, a polarizer 30 disposed on the light-emitting side of the display panel 10, and a supporting structure 40 attached to the non-light-emitting side of the display panel 10. The display module 100 adopts a bottom emission solution. The display panel 10 includes any of the flexible display panels in the above embodiments. Specifically, the display panel 10 includes an ultra-thin glass 1, a touch functional layer 20, a driving circuit layer 2, a light-emitting functional layer 3, and an encapsulation layer 4 laminated on the ultra-thin glass 1 in sequence. The thickness of the ultra-thin glass 1 ranges from 30 microns to 60 microns. The light emitting side of the display panel 10 is also the side facing the light emitting direction of the light emitting functional layer 3.

The structure and function of the display panel 10 of the display module 100 and the components attached to the display panel 10 will be described in detail below:

Please continue to refer to FIG. 4, the touch functional layer 20 is disposed on the ultra-thin glass 1. The touch functional layer 20 adopts an in-cell touch solution, and the touch functional layer 20 is directly formed on the ultra-thin glass 1 of the display panel 10 so that the thickness of the display panel 10 can be reduced, and the integration of the display panel 10 is improved. In addition, the touch functional layer 20 is first formed on the ultra-thin glass 1, and then the driving circuit layer 2 and the light-emitting functional layer 3 are formed, so the touch functional layer 20 can be formed with a high-temperature process without being affected by the low-temperature characteristics of a light emitting device 31 of the light emitting functional layer 3. Thus, the touch accuracy of the display module 100 can be improved.

Figure 5:
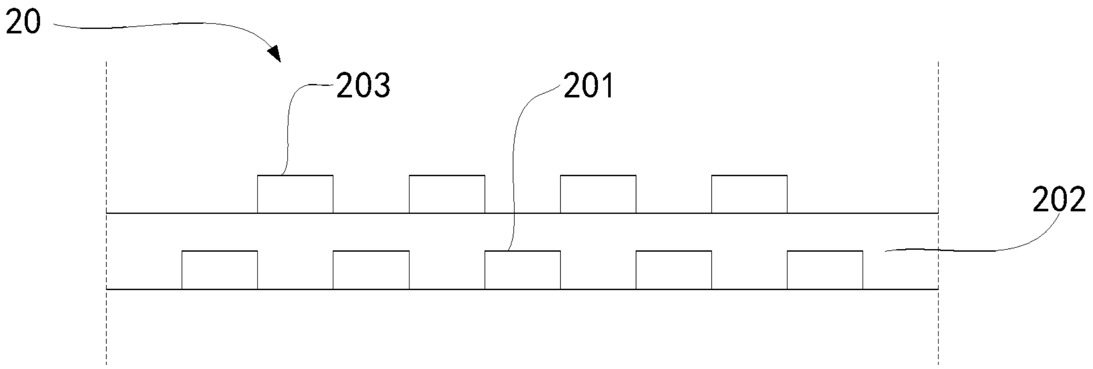
FIG. 5 is a schematic diagram of a cross-sectional structure of a touch functional layer in FIG. 4.

Specifically, please refer to FIG. 5. FIG. 5 is a schematic cross-sectional structure diagram of the touch functional layer 20 in FIG. 4. The touch functional layer 20 adopts mutual capacitive touch, and the touch functional layer 20 includes driving electrodes 201 and sensing electrodes 203. In addition, the driving electrode 201 and the sensing electrode 203 are disposed in different layers, and an insulating layer 202 is disposed between the driving electrode 201 and the sensing electrode 203. Certainly, the present application is not limited to this. The driving electrodes 201 and the sensing electrodes 203 of the touch functional layer 20 of the present application can also be disposed in the same layer. The overlapping part of the driving electrode 201 and the sensing electrode 203 is bridged by a bridge layer, or the touch functional layer 20 may also adopt self-capacitive touch. Moreover, when the in-cell touch solution is adopted, the touch functional layer 20 may also be disposed between the driving circuit layer 2 and the light-emitting functional layer 3. Alternatively, an on-cell touch solution may be adopted, and the touch functional layer 20 is disposed on a side of the ultra-thin glass 1 away from the driving circuit layer 2. Also, the display module 100 may not be provided with the touch functional layer 20, and the present application is not limited thereto.

The driving circuit layer 2 is disposed on the touch functional layer 20, and certainly, between the driving circuit layer 2 and the touch functional layer 20, and between the touch functional layer 20 and the ultra-thin glass 1, a buffer layer (not shown) is also disposed. The buffer layer can prevent undesired impurities or contaminants (such as moisture, oxygen, etc.) from diffusing from the ultra-thin glass 1 into devices that may be damaged by these impurities or contaminants. Also, it can provide a flat top surface.

The driving circuit layer 2 includes an active layer 21, a gate insulating layer 22, a gate 23, an interlayer insulating layer 24, a source 251 and a drain 252, a planarization layer 26, a pixel electrode 27, and a pixel definition layer 28, laminated on the touch functional layer 20 in sequence. The active layer 21 includes a channel region 211 and a source doped region 212 and a drain doped region 213 located on both sides of the channel region 211, wherein the channel region 211 is disposed corresponding to the gate 23. The source 251 and the drain 252 are respectively connected to the source doped region 212 and the drain doped region 213 of the active layer 21 through via holes of the interlayer insulating layer 24. The pixel electrode 27 is connected to the source 251 or the drain 252 through a via hole of the planarization layer 26. The pixel electrode 27 shown in FIG. 4 is connected to the drain 252 through the via hole of the planarization layer 26. The pixel definition layer 28 is disposed on the pixel electrode 27 and the planarization layer 26, and the pixel definition layer 28 is patterned to form pixel openings. The pixel opening exposes a part of the pixel electrode 27 to define an area for setting the light emitting device.

Because the display module 100 adopts bottom emission, in order to improve the light transmittance, the pixel electrode 27 adopts a transparent electrode. The pixel electrode 27 may be formed of a transparent conductive material such as indium tin oxide (ITO), indium zinc oxide (IZO), ZnO, or $In_2O_3$. However, the material of the pixel electrode 27 is not limited thereto, and the pixel electrode 27 may be formed of various materials, and may also be formed in a single-layer or multilayer structure.

It should be noted that the film structure of the driving circuit layer 2 is not limited to the top gate structure shown in FIG. 4. The film structure of the driving circuit layer 2 may also adopt a bottom gate structure or other etch barrier structure.

The light-emitting functional layer 3 is disposed on the driving circuit layer 2, and the light-emitting functional layer 3 includes a light-emitting device 31 and a cathode 32. The light emitting device 31 is formed of a light emitting material printed in the pixel opening of the pixel definition layer 28. The cathode 32 covers the light emitting device 31 and the pixel definition layer 28. The light emitting device 31 emits light under the actions of the driving circuit layer 2 and the cathode 32 to realize pixel display of the display panel 10. The cathode 32 may be a transparent electrode or a reflective electrode. If the cathode 32 is a transparent electrode, the cathode 32 may include a layer formed of a metal with low work function (such as Li, Ca, LiF/Ca, LiF/Al, Al, Ag, Mg, or a combination thereof), and a transparent conductive layer formed of ITO, IZO, ZnO, or $In_2O_3$. If the cathode 32 is a reflective electrode, the cathode 32 may be formed of Li, Ca, LiF/Ca, LiF/Al, Al, Ag, Mg, or a combination thereof. However, the cathode 32 is not limited to these structures and materials, so the cathode 32 can be modified into various forms. It can be understood that setting the cathode 32 as a reflective electrode can further improve the utilization rate of light emitted by the light emitting device 31.

Certainly, the light-emitting functional layer 3 may also include a hole injection layer (HIL) and a hole transport layer (HTL) disposed between the light emitting device 31 and the pixel electrode 27; and an electron injection layer (EIL) and an electron transport layer (ETL) disposed between the light emitting device 31 and the cathode 32.

The encapsulation layer 4 is disposed on the light-emitting functional layer 3, and the encapsulation layer 4 may be encapsulated by a thin film. The thin film encapsulation may be a laminated structure formed by sequentially stacking three thin film layers of a first inorganic encapsulation layer, an organic encapsulation layer, and a second inorganic encapsulation layer, or a laminated structure of more layers. It is configured to protect the light-emitting device 31 of the light-emitting functional layer 3, and prevent water and oxygen from invading the light-emitting device 31 and causing failure.

Please continue to refer to FIG. 3 and FIG. 4. The supporting structure 40 is disposed on the encapsulation layer 4, and the supporting structure 40 includes a backplate 50. The backplate 50 is attached to the encapsulation layer 4. That is, the backplate 50 is disposed on the non-light emitting surface of the display panel 10 to support the film layers of the display panel 10. Certainly, the supporting structure 40 may also include a laminated structure formed of foam, copper foil, graphite, etc., which are disposed on the backplate 50. The laminated structure can not only support each film layer of the display panel 10, but also can buffer and dissipate the heat of the display panel 10.

It is understandable that, in order to better realize the bending performance of the display module 100, a stainless-steel film 60 may be attached to the backplate 50. The backplate 50 and the stainless-steel film 60 jointly form the supporting structure 40 of the display module 100. The stainless-steel film 60 is attached to a side of the backplate 50 away from the encapsulation layer 4 by optical glue. The material of the stainless-steel film 60 includes hard materials such as stainless-steel (such as SUS). Stainless-steel is a high-modulus material, which is not easily deformed when subjected to a force, which can well ensure the bending shape of the display module 100, and further structurally strengthen the backplate 50.

The polarizer 30 is attached to a side of the ultra-thin glass 1 away from the touch functional layer 20 by using an optically clear adhesive (OCA). The polarizer 30 is a circular polarizer, which has an anti-reflection function to prevent external light from entering the display module 100 and being reflected back by the metal film in the display panel, thereby affecting the viewing effect and contrast.

In the display module 100 of this embodiment, the ultra-thin glass 1 of the display panel 10 is formed by thinning the substrate glass. The conventional PI flexible film layer is replaced with the ultra-thin glass 1, so there is no need to use the laser lift-off process to separate the substrate glass and the PI flexible film layer. It prevents problems such as high requirements of cleanliness and laser uniformity for the laser lift-off process, difficulty in implementing on a large-sized display screen, and PI flexible film breakage caused by the existence of foreign particles. Also, it solves the problem that a laser is required to peel the substrate glass and the peeling effect is not good in current manufacturing process of the flexible OLED display screen. In addition, when the display module 100 of this embodiment adopts bottom emission solution, because of the existence of the ultra-thin glass formed by thinning the substrate glass, there is no need to attach an ultra-thin glass as a cover plate to a light-emitting surface. It prevents problems such as cracking of the ultra-thin glass when attaching the ultra-thin glass, which results in serious yield loss.

Figure 6:
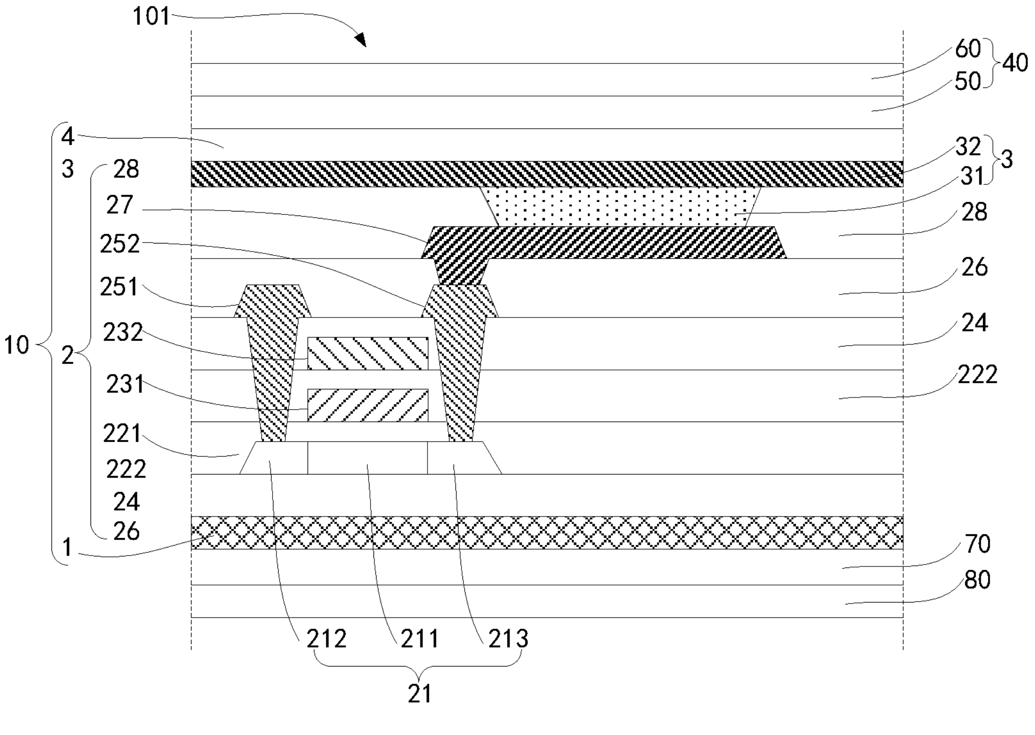
FIG. 6 is a schematic diagram of a second cross-sectional structure of a display module provided by an embodiment of the present application.

In one embodiment, please refer to FIG. 6, which is a schematic diagram of a second cross-sectional structure of a display module provided by an embodiment of the present application. The difference from the foregoing embodiment is that the touch solution of the display module 101 adopts an external touch panel (TP), that is, the touch panel 70 is externally disposed directly on the display panel 10. Specifically, the display module 101 includes a display panel 10, a touch panel 70, and a color film layer 80 attached to a light-emitting side of the display panel 10, a backplate 50 attached to a non-light-emitting side of the display panel 10, and a stainless-steel film 60. The display panel 10 includes an ultra-thin glass 1, a driving circuit layer 2, a light-emitting functional layer 3, and an encapsulation layer 4 laminated on the ultra-thin glass 1 in sequence. The touch panel 70 is directly attached to a side of the ultra-thin glass 1 away from the driving circuit layer 2.

The following will specifically describe the difference in structure of the display module 101 of this embodiment compared with the display module 100 of the above-mentioned embodiment. The same structure and the corresponding function of the structure will not be repeated herein.

Please continue to refer to FIG. 6, because the display module 101 adopts an external TP touch solution, there is no need to provide a touch functional layer in the display panel 10. The display panel 10 includes a driving circuit layer 2, a light-emitting functional layer 3, and an encapsulation layer 4 laminated on the ultra-thin glass 1. Certainly, a buffer layer (not shown) is also provided between the driving circuit layer 2 and the ultra-thin glass 1. In addition, the driving circuit layer 2 adopts a double gate structure. Specifically, the driving circuit layer 2 includes an active layer 21, a first gate insulating layer 221, a first gate 231, a second gate insulating layer 222, a second gate 232, an interlayer insulating layer 24, a source 251 and a drain 252, a planarization layer 26, a pixel electrode 27, and a pixel definition layer 28 laminated on the ultra-thin glass 1 in sequence. A storage capacitor can be formed between the first gate 231 and the second gate 232.

The touch panel 70 can be attached to a light-emitting side of the display panel 10 through a transparent glue (such as OCA glue), that is, directly attached to a side of the ultra-thin glass 1 away from the driving circuit layer 2.

The color film layer 80 can be attached to the touch panel 70 by an optical glue, and the color film layer 80 can replace the function of a conventional polarizer, that is, adopting POL-less technology. The thickness of the conventional polarizer is relatively thick, and this technology can not only reduce the thickness of the functional layer from more than 100 micrometers to less than 5 micrometers, but also improve the light extraction rate. The color film layer 80 is composed of red, green, blue color resists and a black matrix. In an OLED display panel, R/G/B color resists are respectively used for the light emission of their corresponding R/G/B light-emitting sub-pixel units. The black matrix is mainly responsible for preventing the light leakage of the panel and reducing the reflection of the panel. For other descriptions, please refer to the above-mentioned embodiment, which will not be repeated here.

Figure 7:
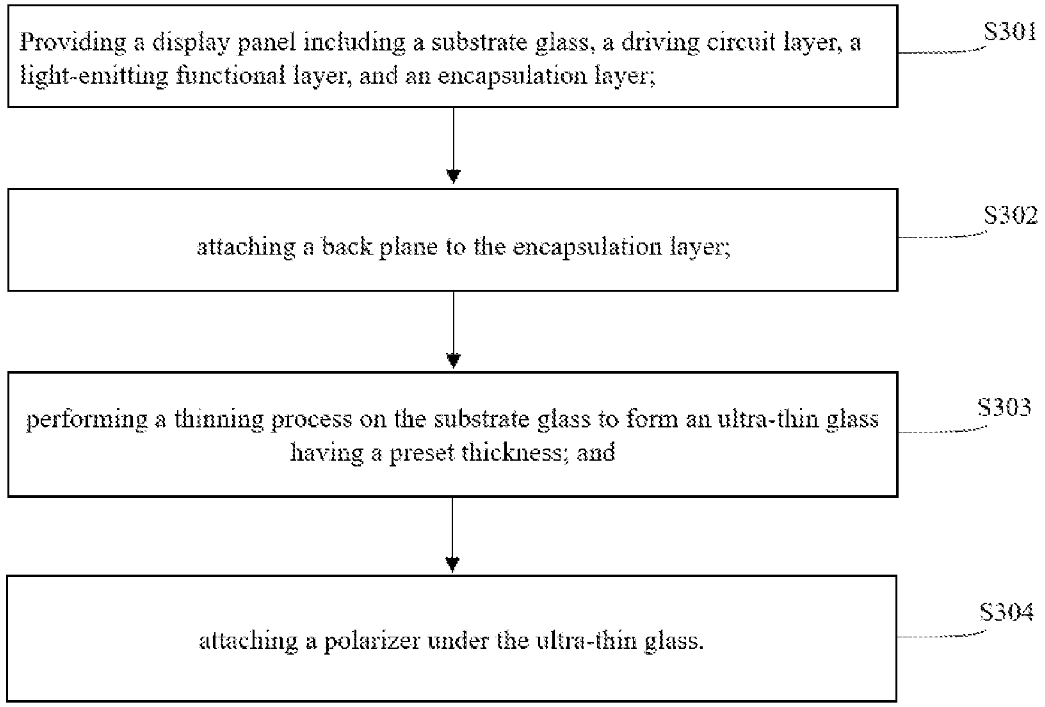
FIG. 7 is a schematic flowchart of a method of manufacturing a display module provided by an embodiment of the present application.

In one embodiment, please refer to FIG. 7, which is a schematic flowchart of a manufacturing method of a display module according to an embodiment of the present application. The manufacturing method of the display module includes the following steps:

S301: Providing a display panel, the display panel including a substrate glass, a driving circuit layer, a light-emitting functional layer, and an encapsulation layer.

Specifically, please refer to FIG. 8 to FIG. 14. FIG. 8 to FIG. 14 are schematic diagrams of film structures obtained in each step of the manufacturing process of the display panel 10 provided by the embodiment of the present application. The manufacturing process of the display panel 10 includes:

Providing a substrate glass 6, and cleaning and drying the substrate glass 6.

Figure 8:
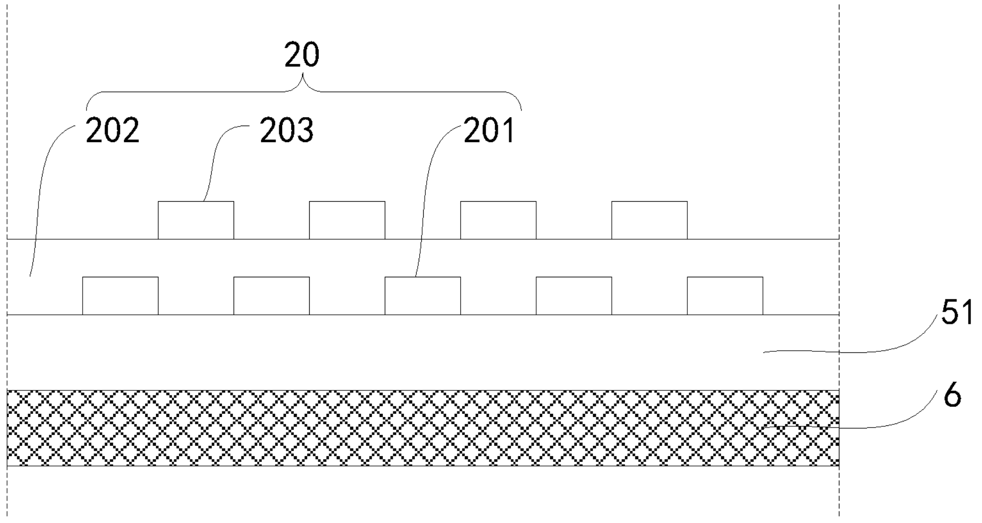
FIG. 8 to FIG. 20 are schematic diagrams of film structures obtained in each step of the display module manufacturing method provided by embodiments of the present application.

Forming a touch functional layer 20 on the substrate glass 6. Specifically, a first buffer layer 51 is deposited on the substrate glass 6, and a driving electrode layer is deposited on the first buffer layer 51, and the driving electrode layer is patterned to form the driving electrode 201. An insulating layer 202 is deposited on the driving electrode 201 and the first buffer layer 51, and a sensing electrode layer is deposited on the insulating layer 202. The sensing electrode layer is patterned to form a sensing electrode 203, and the touch functional layer 20 as shown in FIG. 8 is formed. Wherein the materials of the driving electrode 201 and the sensing electrode 203 include metals such as aluminum (Al) and copper (Cu), or transparent conductive materials such as indium tin oxide (ITO). When metals such as Al and Cu are used, both the driving electrode 201 and the sensing electrode 203 can be made into mesh-shaped patterned electrodes to facilitate light transmission.

Figure 9:
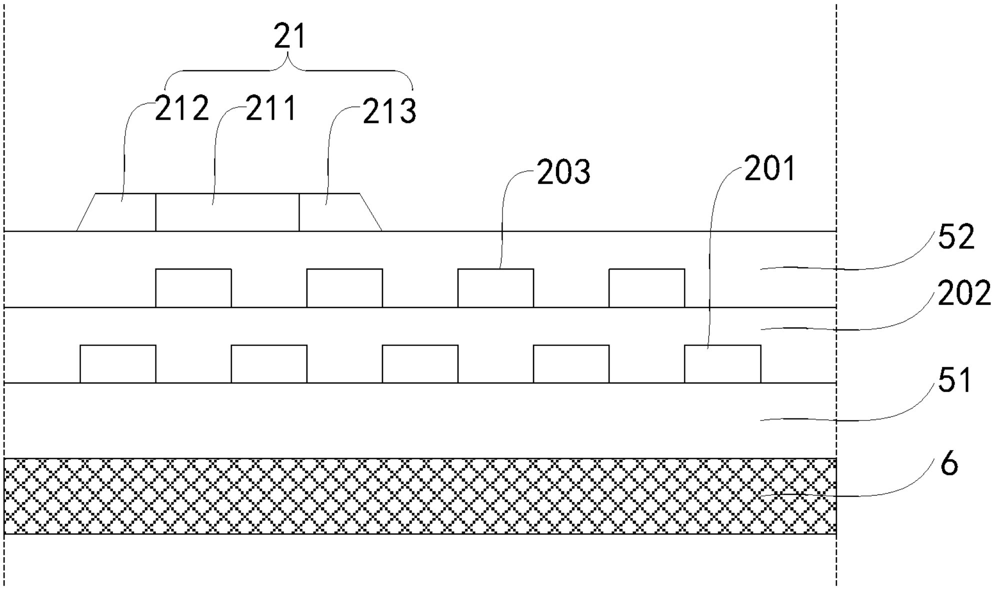

Forming a driving circuit layer 2 on the touch functional layer 20. Specifically, a second buffer layer 52 is deposited on the sensing electrode 203 and the insulating layer 202, and a semiconductor material is deposited on the second buffer layer 52. The semiconductor material is patterned to form a semiconductor pattern as an active layer 21. The thickness of the active layer 21 can be 450 angstroms, but the present application is not limited thereto. As shown in FIG. 9, the active layer 21 includes a channel region 211 and a source doped region 212 and a drain doped region 213 positioned on both sides of the channel region 211. The source doped region 212 and the drain doped region 213 may be formed by ion doping. The semiconductor material includes low temperature poly silicon (LTPS), aluminum zinc oxide (AlZnO), aluminum zinc tin oxide (AlZnSnO), gallium zinc tin oxide (GaZnSnO), indium gallium oxide (InGaO), indium gallium zinc oxide (InGaZnO), indium tin zinc oxide (InSnZnO), indium zinc oxide (InZnO), hafnium indium zinc oxide (HfInZnO), or zirconium tin oxide (ZrSnO), and the like.

Figure 10:
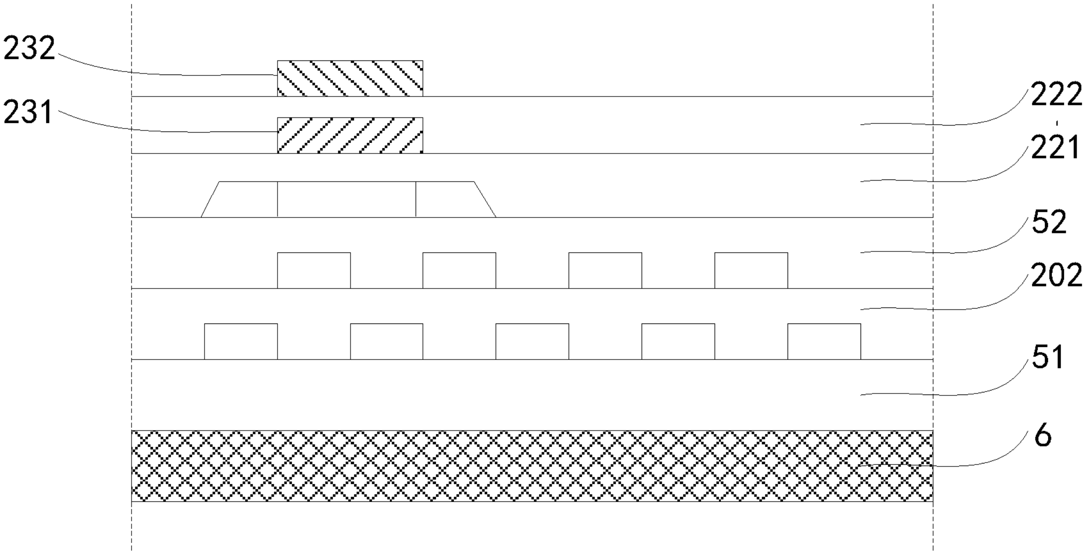

Further, a first gate insulating layer 221 is deposited on the active layer 21 and the second buffer layer 52, and a first gate layer is deposited on the first gate insulating layer 221, and the first gate layer is patterned to form a first gate 231. A second gate insulating layer 222 is deposited on the first gate 231 and the first gate insulating layer 221, and a second gate layer is deposited on the second gate insulating layer 222, and the second gate layer is patterned to form a second gate 232. The film structure shown in FIG. 10 is formed. Certainly, after the first gate layer and the second gate layer are patterned, not only the first gate 231 and the second gate 232 but also other signal lines such as gate scanning lines can be formed.

Figure 11:
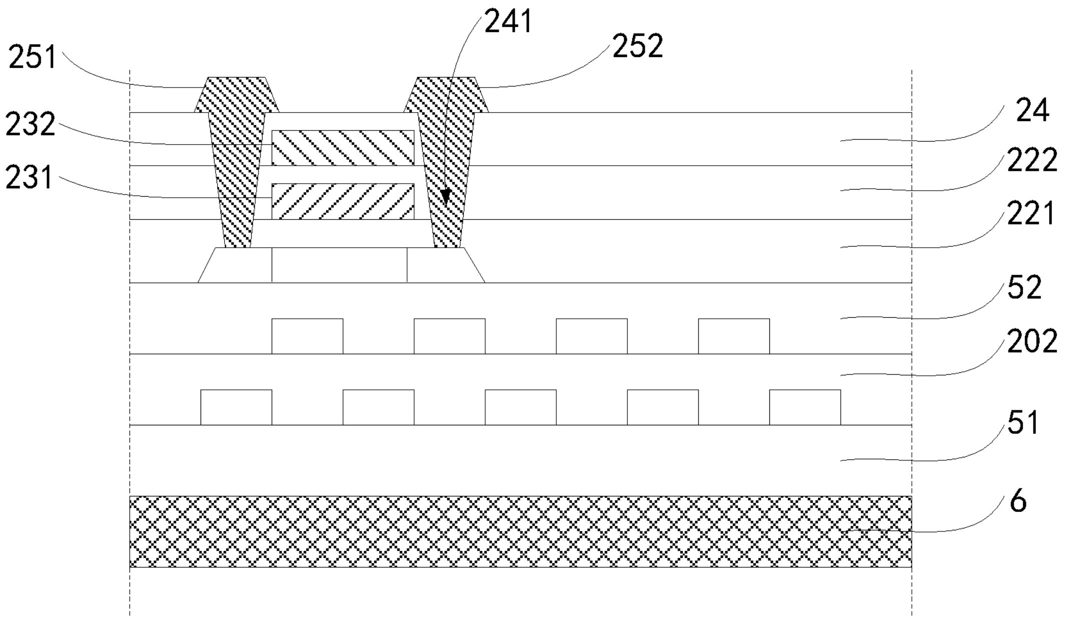

Further, an interlayer insulating layer 24 is deposited on the second gate 232 and the second gate insulating layer 222, and the interlayer insulating layer 24 is patterned to form a plurality of first via holes 241. The first via hole 241 penetrates the interlayer insulating layer 24, the second gate insulating layer 222, and the first gate insulating layer 221 to the active layer 21. A source and drain layer is deposited on the interlayer insulating layer 24 and in the first via hole 241, and the source and drain layer is patterned to form a source 251 and a drain 252. The source 251 and the drain 252 are respectively connected to the source doped region and the drain doped region through the first via hole 241 to form a structure as shown in FIG. 11. Certainly, after the source and drain layers are patterned, not only the source 251 and the drain 252 but also signal lines such as data lines and power lines can be formed.

Figure 12:
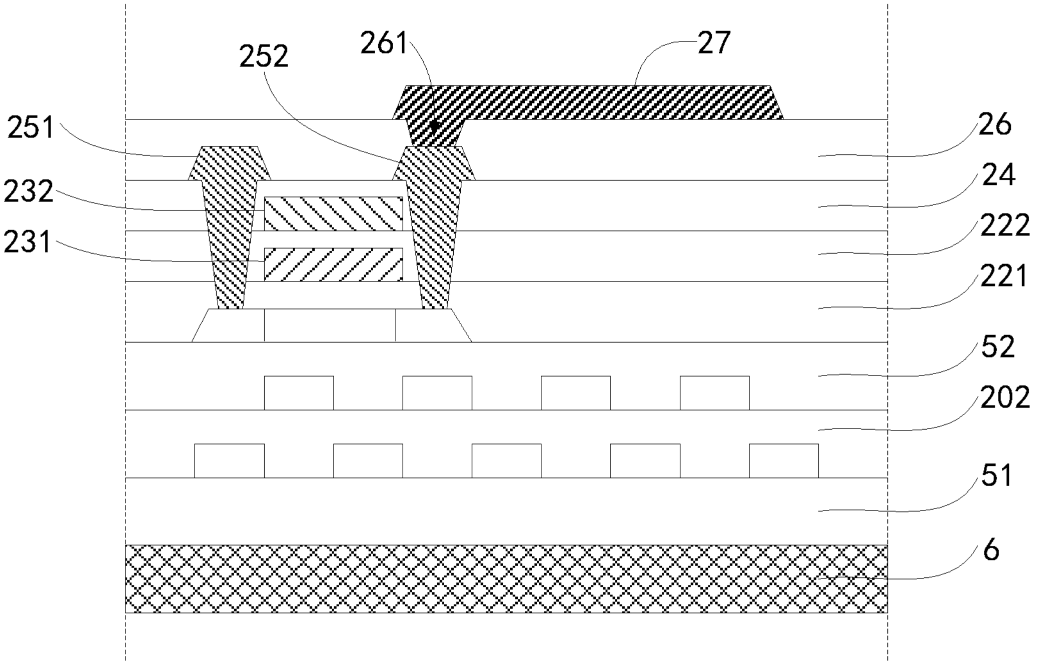

Further, a planarization layer 26 is deposited on the source 251, the drain 252, and the interlayer insulating layer 24. The planarization layer 26 is patterned to form a plurality of second via holes 261. The second via hole 261 penetrates the planarization layer 26 to expose the source 251 or the drain 252. A transparent conductive material, such as indium tin oxide, is deposited on the planarization layer 26 and in the second via hole 261, and the transparent conductive material is patterned to form a pixel electrode 27. The pixel electrode 27 is connected to the drain 252 through the second via hole 261 to form a structure as shown in FIG. 12.

Figure 13:
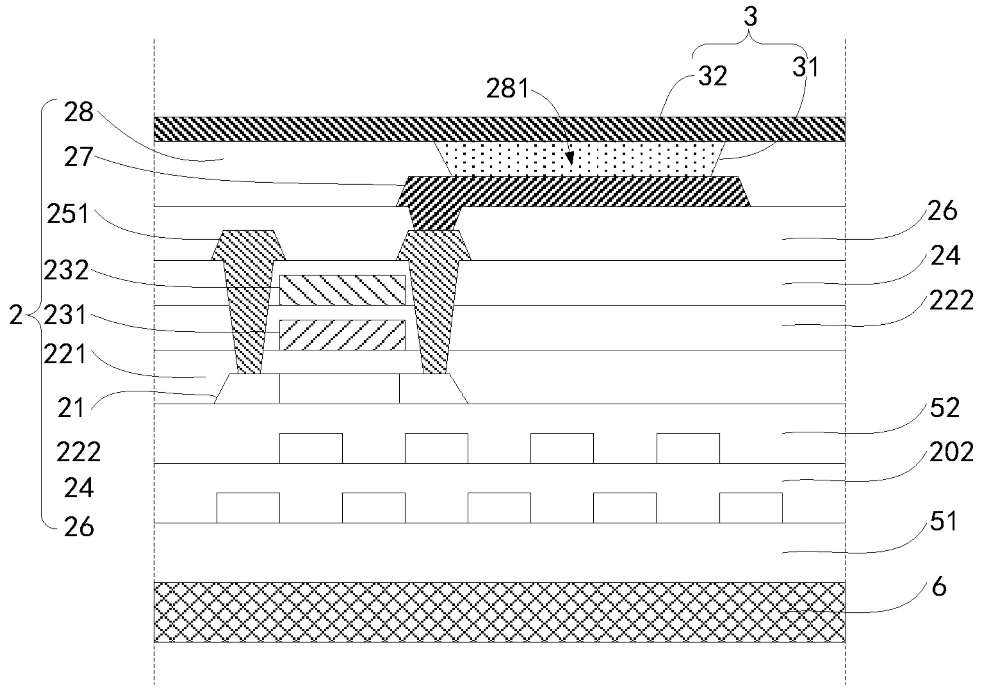

Further, a pixel definition layer 28 is deposited on the pixel electrode 27 and the planarization layer 26, and the pixel definition layer 28 is patterned to form a pixel opening 281 to expose a part of the pixel electrode 27, as shown in FIG. 13.

A light-emitting functional layer 3 is formed on the driving circuit layer 2. Specifically, a light-emitting material is evaporated in the pixel opening 281 to form a light-emitting device 31. A metal material, such as Al, is vapor-deposited on the light-emitting device 31 and the pixel definition layer 28, and the metal material is patterned to form a reflective cathode 32. The light-emitting functional layer structure shown in FIG. 13 is formed. Wherein, the cathode 32 of the light-emitting functional layer 3 is made as a reflective electrode, which can improve the utilization rate of light. Certainly, the light-emitting functional layer 3 may further include a hole injection layer and a hole transport layer disposed between the light-emitting device 31 and the pixel electrode 27, and an electron injection layer and an electron transport layer disposed between the light-emitting device 31 and the cathode 32.

Figure 14:
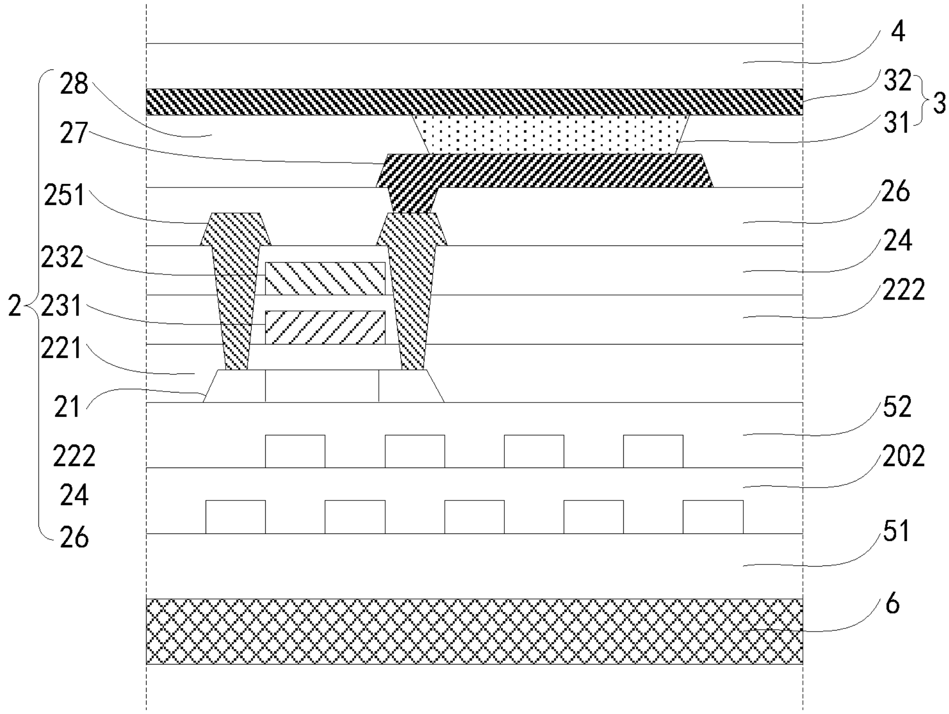

An encapsulation layer 4 is formed on the light-emitting functional layer 3 to form a film structure as shown in FIG. 14. Specifically, the encapsulation layer 4 may be encapsulated by a thin film. The thin film encapsulation may be a laminated structure formed by sequentially stacking three layers of a first inorganic encapsulation layer, an organic encapsulation layer, and a second inorganic encapsulation layer or a laminated structure of more layers. It is configured to protect the light-emitting device 31 of the light-emitting functional layer 3 to prevent water and oxygen intrusion from causing the light-emitting device 31 to fail.

Figure 15:
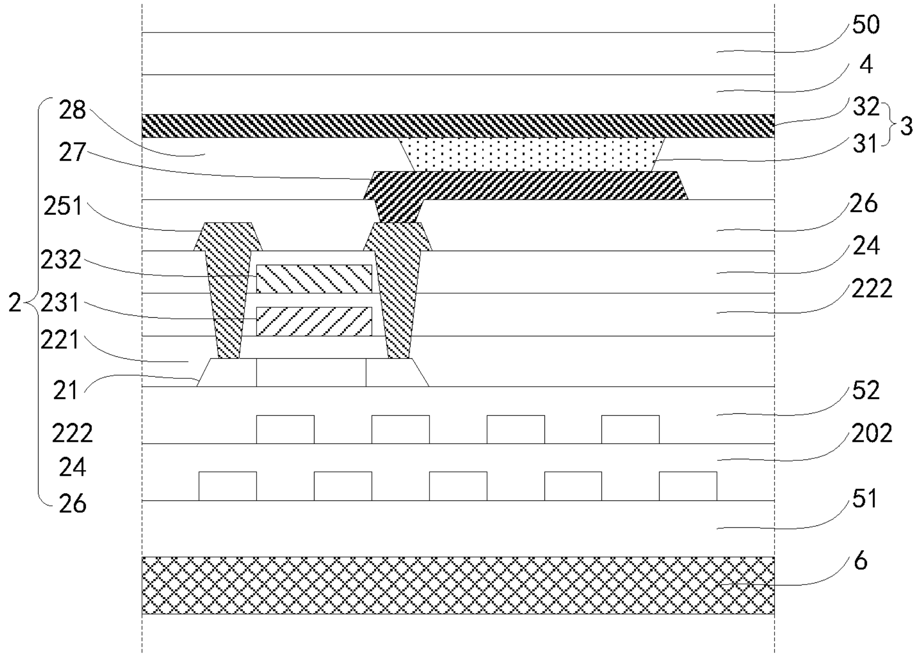

S302: A backplate 50 is attached to the encapsulation layer 4. Specifically, the backplate 50 is attached to a side of the encapsulation layer 4 away from the light-emitting functional layer 3 by using an optical glue (such as OCA, etc.) to form a film structure as shown in FIG. 15. The backplate 50 can support each film layer of the display panel 10.

S303: A thinning process is performed on the substrate glass 6 to thin the substrate glass 6 to a predetermined thickness to form an ultra-thin glass 1.

Figure 16:
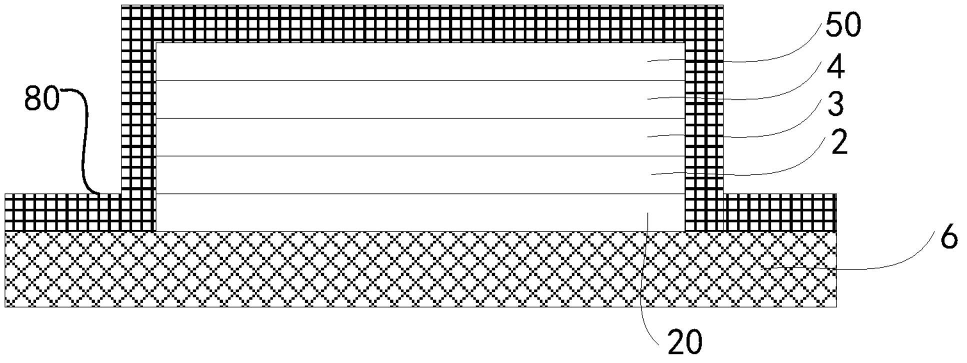

Specifically, the step of performing a thinning process on the substrate glass 6 and thinning the substrate glass 6 to a predetermined thickness to form the ultra-thin glass 1 includes:

A protective film 80 is attached to the backplate 50, and the protective film 80 covers the backplate 50 and sidewalls of the driving circuit layer 2, the light-emitting functional layer 3, and the encapsulation layer 4 to form a structure shown in FIG. 16. It is understandable that, because the touch functional layer 20 is also disposed on the substrate glass 6, the protective film 80 also covers the sidewall of the touch functional layer 20. The protective film 80 needs to have a certain degree of adhesion and can be attached to the backplate 50 and the sidewalls of the touch functional layer 20, the driving circuit layer 2, the light emitting functional layer 3, and the encapsulation layer 4. In addition, the protective film 80 also needs to be resistant to acid liquids such as etching liquids to prevent acid liquids such as etching liquids from corroding the display panel and causing display failure. The material of the protective film 80 can be a protective film such as polyethylene terephthalate (PET) protective film. The PET protective film has good chemical resistance stability, low water absorption, resistance against weak acid, and organic solvent resistance.

The substrate glass 6 is placed in an etching solution with a predetermined concentration. Specifically, the etching solution includes an acid etching solution, etc., the acidic etching solution may be hydrofluoric acid (HF). Using the principle that the HF chemical solution can chemically react with silicon dioxide ($SiO2$) on the glass surface to dissolve it, the substrate glass 6 is etched to reduce the thickness of the substrate glass 6.

Figure 17:
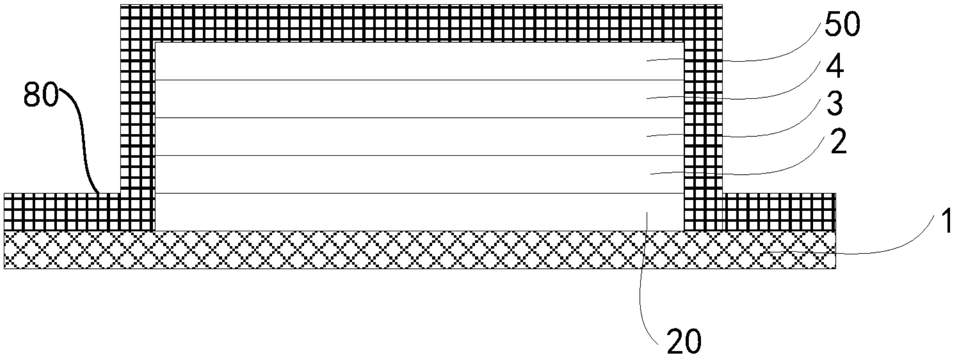

After a predetermined period of time, the substrate glass 6 is thinned to a predetermined thickness to form an ultra-thin glass 1, and the ultra-thin glass 1 is taken out, as shown in FIG. 17. Specifically, the predetermined period of time and the predetermined concentration can be set according to the predetermined thickness to which the substrate glass 6 is to be thinned, wherein the predetermined thickness ranges from 30 μm to 60 μm.

Figure 18:
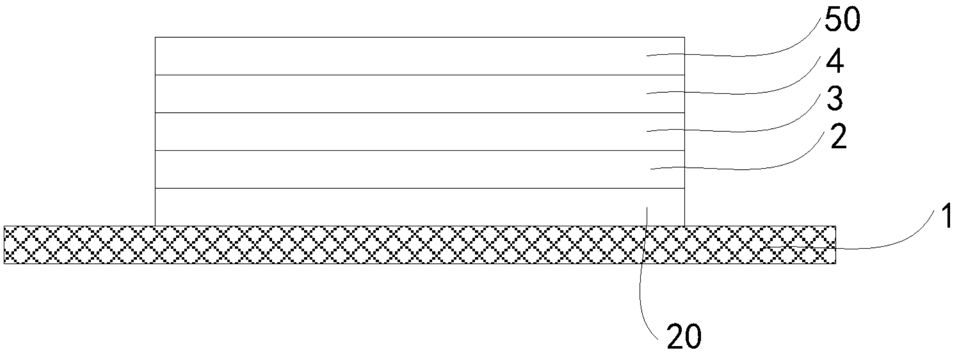

The ultra-thin glass 1 is cleaned, and the protective film 80 is removed to form a structure as shown in FIG. 18. Specifically, after taking out the ultra-thin glass 1 from the etching solution, the ultra-thin glass 1 is cleaned to prevent the etching solution remaining on the ultra-thin glass.

In one embodiment, the step of thinning the substrate glass 6 to thin the substrate glass 6 to a predetermined thickness to form the ultra-thin glass 1 may also be implemented in the following manner:

The substrate glass 6 is reduced to a predetermined thickness by physical grinding to form an ultra-thin glass 1, and a surface of the ultra-thin glass 1 is formed with a convex-concave structure. Specifically, physical grinding methods include polishing with mechanical equipment, a polishing liquid medium is formed by using polishing powder and pure water. Under a certain pressure, it flows between the tray of the machine table and the substrate glass 6, and the machine is operated to make a relative movement, so that the hard abrasive particles directly contact the surface of the substrate glass 6, thereby reducing the thickness of the substrate glass 6. When the physical grinding method is used, the surface of the ultra-thin glass 1 can be formed with convex and concave structures by controlling the grinding process. The convex-concave structure can increase the contact area between the component to be attached (such as a polarizer) and the ultra-thin glass 1 and increase the adhesion between the two.

In another embodiment, the step of thinning the substrate glass 6 to thin the substrate glass 6 to a predetermined thickness to form the ultra-thin glass 1 can also be implemented in the following manner:

The substrate glass 6 is thinned to a predetermined thickness by plasma etching to form an ultra-thin glass 1, and the surface of the ultra-thin glass 1 is formed with a convex-concave structure.

Figure 19:
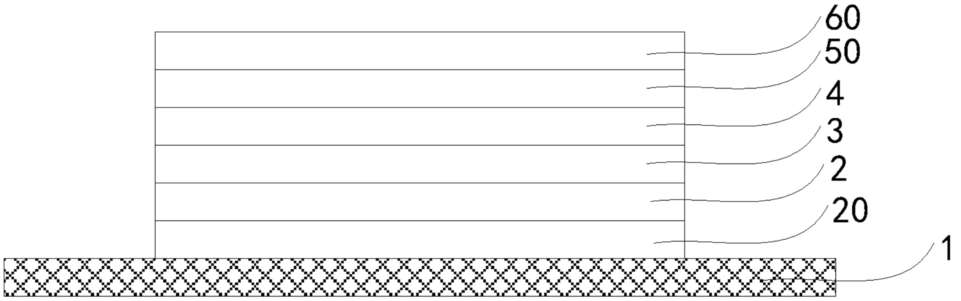

Further, the substrate glass 6 is thinned, and after the substrate glass 6 is thinned to a predetermined thickness to form an ultra-thin glass 1, a stainless-steel film 60 is attached on the backplate 50 to form a structure shown in FIG. 19.

The stainless-steel film 60 is attached to a side of the backplate 50 away from the encapsulation layer 4 by transparent optical glue. The material of the stainless-steel film 60 includes hard materials such as stainless-steel (such as SUS). Stainless-steel is a high-modulus material, which is not easily deformed when subjected to a force, which can well ensure the bending shape of the display module 100.

Certainly, a laminated structure formed of foam, copper foil, graphite, etc. can also be disposed between the backplate 50 and the stainless-steel film 60. The laminated structure can not only support each film layer of the display panel 10, but also can buffer and dissipate the heat of the display panel 10.

Figure 20:
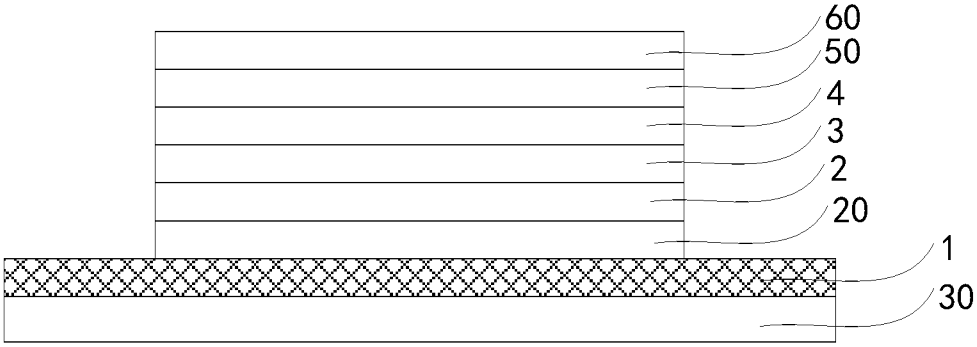

S304: A polarizer 30 is attached under the ultra-thin glass 1 to form a structure shown in FIG. 20. In one embodiment, the difference from the manufacturing method of the display module in the foregoing embodiment is that the display panel 10 does not have an integrated touch functional layer 20. The display module needs an external touch panel to realize the touch function. Therefore, the step of attaching the polarizer 30 under the ultra-thin glass 1 includes: attaching a touch panel under the ultra-thin glass 1 and attaching the polarizer 30 under the touch panel using an optical glue.

It should be noted that the manufacturing method of the display module provided in the present application is only described in detail by taking the display module of one of the foregoing embodiments as an example. The present application is not limited to this, and the manufacturing method of the display module provided in the present application is also applicable to manufacturing any display module in the foregoing embodiments, and will not be repeated herein.

In one embodiment, a display device is provided, and the display device includes the display module of one of the foregoing embodiments.

According to the above embodiment, it can be known:

A display module, a manufacturing method thereof, and a display device are provided. The manufacturing method of the display module includes providing a display panel including a substrate glass, a driving circuit layer, a light-emitting functional layer, and an encapsulation layer; attaching a backplate on the encapsulation layer, and performing a thinning process on the substrate glass to form an ultra-thin glass having a predetermined thickness. Ultra-thin glass is obtained by processing the substrate glass, and the conventional PI flexible film for supporting the panel is replaced with the ultra-thin glass, so there is no need to use a laser lift-off process to separate the substrate glass and the PI flexible film. It can prevent problems such as high requirements for cleanliness and laser uniformity in the laser lift-off process, difficulty in implementing on a large-sized display screen, and PI flexible film breakage caused by the existence of foreign particles. Also, it solves the problem that a laser is required to peel the substrate glass and the peeling effect is not good in current manufacturing process of the flexible OLED display screen. In addition, when the display module of the present application adopts bottom emission, due to the existence of ultra-thin glass formed by thinning the substrate glass, there is no need to attach an ultra-thin glass as a cover plate on a light-emitting surface. It prevents problems such as cracking of the ultra-thin glass when attaching the ultra-thin glass, which results in serious yield loss.

As mentioned above, although the present application has been disclosed in the preferred embodiments, the preferred embodiments are not intended to limit the application. Those of ordinary skill in the art can make various changes and modifications without departing from the spirit and scope of the present application. Therefore, the protection scope of the present application is subject to the scope defined by the claims.

What is claimed is:

1. A display module, comprising:
an ultra-thin glass;
a driving circuit layer disposed on a side of the ultra-thin glass;
a light-emitting functional layer disposed on a side of the driving circuit layer away from the ultra-thin glass;
an encapsulation layer disposed on a side of the light-emitting functional layer away from the driving circuit layer; and
a supporting structure disposed on a side of the encapsulation layer away from the light-emitting functional layer;
wherein the supporting structure comprises a backplate and a stainless-steel film, the backplate is attached to the encapsulation layer, and the stainless-steel film is attached to the backplate.

2. The display module according to claim 1, further comprising a polarizer disposed on a side of the ultra-thin glass away from the driving circuit layer.

3. The display module according to claim 1, further comprising a color film layer disposed on a side of the ultra-thin glass away from the driving circuit layer.

4. The display module according to claim 1, further comprising a touch functional layer disposed between the ultra-thin glass and the driving circuit layer.

5. The display module according to claim 1, further comprising a touch panel attached to a side of the ultra-thin glass away from the driving circuit layer.

6. The display module according to claim 1, wherein a thickness of the ultra-thin glass ranges from 30 microns to 60 microns.

7. A display device, comprising a display module comprising:
an ultra-thin glass;
a driving circuit layer disposed on a side of the ultra-thin glass;
a light-emitting functional layer disposed on a side of the driving circuit layer away from the ultra-thin glass;
an encapsulation layer disposed on a side of the light-emitting functional layer away from the driving circuit layer; and
a supporting structure disposed on a side of the encapsulation layer away from the light-emitting functional layer; and
a touch functional layer disposed between the ultra-thin glass and the driving circuit layer.

8. The display device according to claim 7, further comprising a touch panel attached to a side of the ultra-thin glass away from the driving circuit layer.

9. A display module, comprising:
an ultra-thin glass;
a driving circuit layer disposed on a side of the ultra-thin glass;
a light-emitting functional layer disposed on a side of the driving circuit layer away from the ultra-thin glass;
an encapsulation layer disposed on a side of the light-emitting functional layer away from the driving circuit layer; and
a supporting structure disposed on a side of the encapsulation layer away from the light-emitting functional layer;

a polarizer disposed on a side of the ultra-thin glass away from the driving circuit layer.

* * * * *